(12) United States Patent
Kuo et al.

(10) Patent No.: US 8,580,657 B2
(45) Date of Patent: Nov. 12, 2013

(54) PROTECTING SIDEWALLS OF SEMICONDUCTOR CHIPS USING INSULATION FILMS

(75) Inventors: Yian-Liang Kuo, Hsin-Chu (TW);
Chien-Yi Chen, Hsin-Chu (TW);
Yu-Ting Lin, Hsin-Chu (TW);
Yung-Sheng Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 348 days.

(21) Appl. No.: 12/236,190

(22) Filed: Sep. 23, 2008

(65) Prior Publication Data

US 2010/0072635 A1    Mar. 25, 2010

(51) Int. Cl.
*H01L 21/304* (2006.01)

(52) U.S. Cl.
USPC ............ 438/465; 257/626; 257/797; 438/462

(58) Field of Classification Search
USPC .................................. 257/797; 438/462, 465
See application file for complete search history.

(56) References Cited

U.S. PATENT DOCUMENTS

| | | | | |
|---|---|---|---|---|
| 5,742,094 | A * | 4/1998 | Ting | 257/620 |
| 6,573,157 | B1 * | 6/2003 | Sato | 438/462 |
| 6,607,970 | B1 | 8/2003 | Wakabayashi | |
| 6,608,970 | B1 | 8/2003 | Shirota | |
| 2004/0121562 | A1 * | 6/2004 | Wakui et al. | 438/465 |
| 2005/0040498 | A1 * | 2/2005 | Dias et al. | 257/620 |
| 2007/0178667 | A1 * | 8/2007 | Lee et al. | 438/465 |
| 2008/0251891 | A1 * | 10/2008 | Chou et al. | 257/626 |

FOREIGN PATENT DOCUMENTS

CN            1297584 A     5/2001

OTHER PUBLICATIONS

Chen, W-M, et al., "3DIC Wafer Level Packaging for CMOS Sensor and Logic IC's," Oct. 9, 2008, 36 pages, WMC, Xintec R & D.

* cited by examiner

*Primary Examiner* — Ha Tran T Nguyen
*Assistant Examiner* — Raj R Gupta
(74) *Attorney, Agent, or Firm* — Slater & Matsil, L.L.P.

(57) ABSTRACT

A method of forming an integrated circuit structure includes providing a wafer having a first semiconductor chip, a second semiconductor chip, and a scribe line between and adjoining the first semiconductor chip and the second semiconductor chip; forming a notch in the scribe line, wherein the notch has a bottom no higher than a top surface of a semiconductor substrate in the wafer; forming a first insulation film over the wafer, wherein the first insulation film extends into the notch; removing a portion of the first insulation film from a center of the notch, wherein a remaining portion of the first insulation film comprises an edge in the notch; and sawing the wafer to separate the first semiconductor chip and the second semiconductor chip.

14 Claims, 18 Drawing Sheets

PROTECTING SIDEWALLS OF SEMICONDUCTOR CHIPS USING INSULATION FILMS

TECHNICAL FIELD

This invention relates generally to integrated circuit formation processes, and more particularly to protecting integrated circuits and interconnection structures from corrosion and delamination.

BACKGROUND

In a typically integrated circuit formation process, semiconductor wafers, each including a plurality of identical semiconductor chips, are manufactured first. After the manufacturing, the semiconductor wafers are sawed to separate the semiconductor chips, so that each of the semiconductor chips may be packaged individually.

On a semiconductor wafer, scribe lines are placed between the semiconductor chips. The scribe lines may be free from integrated circuits, or have test circuits formed therein, wherein the test circuits may be sacrificed without affecting the functionality of the semiconductor chips.

Typically, seal rings are formed to protect the integrated circuits in the semiconductor chips from moisture and contaminations. However, for the packaging processes, some of the back-end-of-line processes need to be performed for forming bond pads and/or mounting solder balls. These processes include forming protection layers (molding compounds), forming redistribution lines, and forming bond pads. Various layers of materials and corresponding interfaces are thus created. These interfaces are not properly protected, and some of the interfaces may be exposed to the external environment after the die-sawing process for separating the semiconductor chips. As a result, moisture may penetrate through these interfaces and corrodes the copper lines in the semiconductor chips. In addition, since the formation of copper lines often involves fluorine, the corrosion of the copper lines further results in the fluorine to be released. Fluorine has the effect of accelerating the corrosion of the aluminum pad by moisture. Further, the exposure of the interfaces may further cause the delamination of the protection layers. Any of the above-discussed problems may cause the degradation of the circuit performance, or circuit failure. A new integrated method for protecting the interfaces from moisture penetration is thus needed.

SUMMARY OF THE INVENTION

In accordance with one aspect of the present invention, a method of forming an integrated circuit structure includes providing a wafer having a first semiconductor chip, a second semiconductor chip, and a scribe line between and adjoining the first semiconductor chip and the second semiconductor chip; forming a notch in the scribe line; and forming an insulation film over the wafer, and removing a portion of the insulation film from a center of the notch. The insulation film extends into the notch. The notch has a bottom no higher than a top surface of a semiconductor substrate in the wafer. A remaining portion of the insulation film includes an edge in the notch. The method further includes sawing the wafer to separate the first semiconductor chip and the second semiconductor chip.

In accordance with another aspect of the present invention, a method of forming an integrated circuit structure includes providing a wafer, which has a semiconductor substrate. The wafer includes an interconnect structure over the semiconductor substrate; a first semiconductor chip, including a first portion of the semiconductor substrate and a first portion of the interconnect structure, a second semiconductor chip, including a second portion of the semiconductor substrate and a second portion of the interconnect structure; and a scribe line between and adjoining the first semiconductor chip and the second semiconductor chip. The method further includes forming a notch in the scribe line. The notch extends from a top surface of the wafer to below a top surface of the semiconductor substrate and extends substantially from one end to an opposite end of the scribe line. The method further includes forming a first insulation film over the wafer with the first insulation film extending into the notch; patterning the first insulation film to remove a portion of the first insulation film from a center of the notch with a remaining portion of the first insulation film including a first edge in the notch; forming a second insulation film over the first insulation film with the second insulation film extending into the notch; patterning the second insulation film to remove a portion of the second insulation film from the center of the notch with a remaining portion of the second insulation film including a second edge in the notch; and sawing the wafer to separate the first semiconductor chip and the second semiconductor chip.

In accordance with yet another aspect of the present invention, a method of forming an integrated circuit structure includes providing a wafer. The wafer has a first semiconductor chip, a second semiconductor chip, and a scribe line between and adjoining the first semiconductor chip and the second semiconductor chip. The method further includes forming a notch in the scribe line, wherein the notch extends from a top surface of the wafer into a semiconductor substrate in the wafer, and wherein the notch extends substantially from one end to an opposite end of the scribe line. The method further includes forming an insulation film over the wafer. The insulation film extends into the notch. A portion of the insulation film in the notch has a top surface lower than a top surface of a portion of the insulation film directly over the first chip. The method further includes patterning the insulation film to remove a portion of the insulation film from a center of the notch; and sawing the wafer to separate the first semiconductor chip and the second semiconductor chip.

In accordance with yet another aspect of the present invention, an integrated circuit structure includes a wafer, which has a first semiconductor chip, a second semiconductor chip, and a scribe line between and adjoining the first semiconductor chip and the second semiconductor chip. The integrated circuit structure further includes a notch in the scribe line and extending from a top surface of the wafer into the wafer, wherein the notch has a bottom no higher than a top surface of a semiconductor substrate in the wafer; and an insulation film over the wafer. The insulation film has a first portion covering the first semiconductor chip and extending into the notch. The first portion of the insulation film has a first edge in the notch.

In accordance with yet another aspect of the present invention, an integrated circuit structure includes a semiconductor chip, and a semiconductor substrate in the semiconductor chip. The semiconductor substrate has an edge. The integrated circuit structure further includes an interconnect structure over the semiconductor substrate; and a notch on an edge of the semiconductor chip and extending from one end to an opposite end of the edge. The edge of the semiconductor substrate is a lower portion of the edge of the semiconductor chip. The notch has a bottom lower than a top surface of semiconductor substrate. The integrated circuit structure further includes an insulation film over the interconnect structure and extending into the notch. An edge of the insulation film in the notch is substantially parallel to, and horizontally spaced apart from, the edge of the semiconductor substrate.

In accordance with yet another aspect of the present invention, an integrated circuit structure includes a semiconductor chip, and a semiconductor substrate in the semiconductor chip. The semiconductor substrate has an edge. The integrated circuit structure further includes an interconnect structure over the semiconductor substrate; and a notch on an edge of the semiconductor chip and extending from one end to an opposite end of the edge. The edge of the semiconductor substrate is a portion of the edge of the semiconductor chip. The notch extends into the semiconductor substrate. The integrated circuit structure further includes an insulation film over the semiconductor substrate and extending into the notch. The insulation film has a top surface including a first portion directly over the notch, and a second portion outside of the notch. The first portion is lower than the second portion.

The advantageous features of the present invention include improved protection to the interfaces of semiconductor chips.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel wafer level chip-scale package and methods for forming the same are provided. The intermediate stages of manufacturing preferred embodiments of the present invention are illustrated. The variations of the preferred embodiments are also discussed. Throughout the various views and illustrative embodiments of the present invention, like reference numbers are used to designate like elements.

Figure 1:
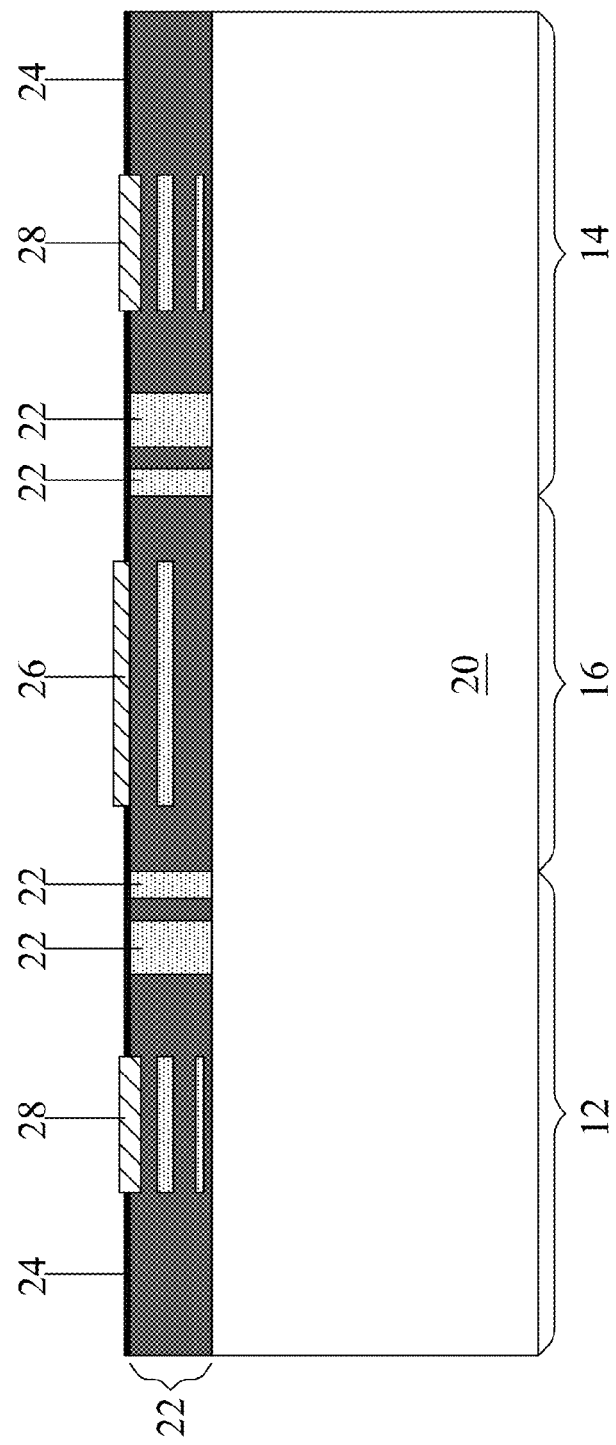
FIGS. 1 through 16 are cross-sectional views of intermediate stages in the manufacturing of embodiments of the present invention.

FIG. 1 illustrates wafer 10 including a plurality of semiconductor chips. For the sake of simplicity, only portions of two chips 12 and 14 are shown. Wafer 10 includes semiconductor substrate 20, and the overlying interconnect structures 22. Semiconductor substrate 20 may be formed of silicon or other commonly used semiconductor materials such as silicon germanium or the like. Integrated circuit devices such as transistors, capacitors, resistors (not shown), or the like, may be formed on the surface of semiconductor substrate 20. As is known in the art, the interconnect structure 22 may include inter-layer dielectric (ILD) (not shown), contact plugs (not shown) in the ILD, inter-metal dielectrics (IMD) (not shown), and metal lines and vias (not shown) in the IMD. Passivation layer 24 may be formed as a top portion of interconnect structure 22, and may include silicon nitride on silicon oxide, or the like. Pads 28 are exposed through passivation layer 24, and may be electrically connected to the integrated circuits on semiconductor substrate 20. Pads 28 may be formed of aluminum, copper, silver, tungsten, or combinations thereof.

Scribe lines are formed between chips. For example, scribe line 16 is formed between chips 12 and 14, and is confined between seal rings 22, which are parts of chips 12 and 14. As is known in the art, seal rings 22 are formed of interconnected metal lines and vias close to the parameters of the chips, wherein seal rings 22 may form a close loop. Within scribe line 16 are test circuits (not shown) and test pads (for example, test pad 26) for connecting the test circuits to probe pins of the test equipment.

Figure 2:
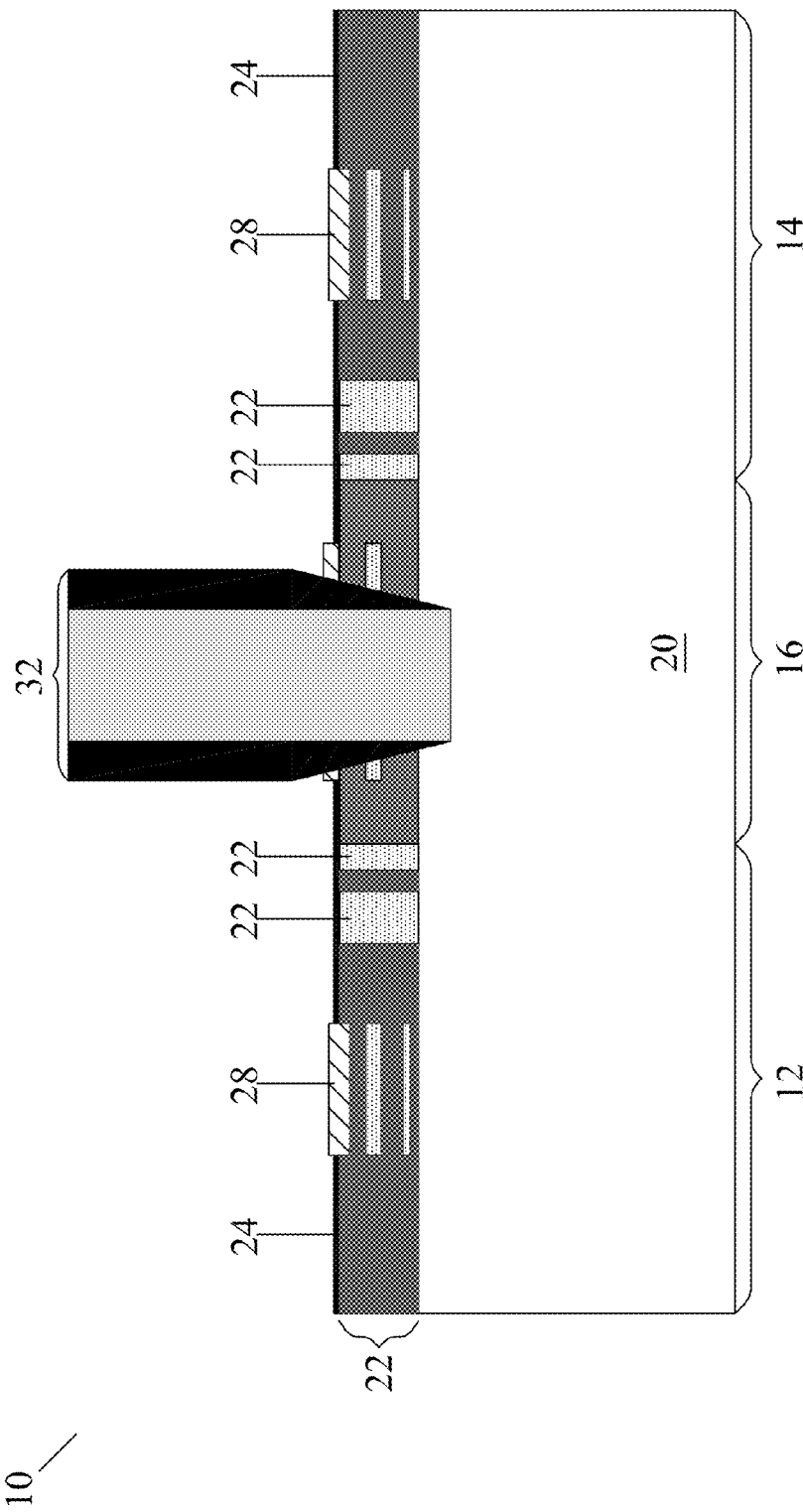
Figure 3A:
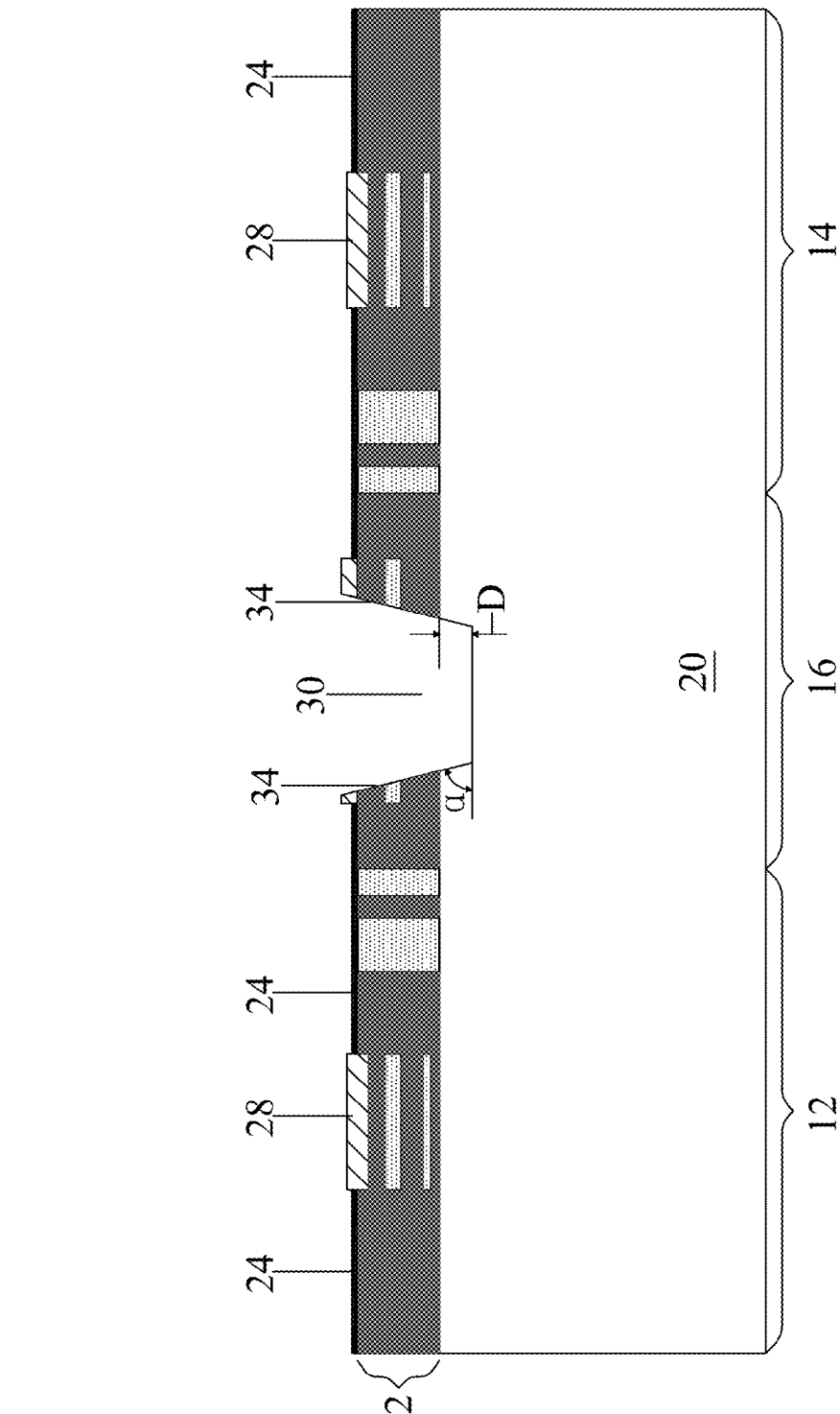
Figure 3B:
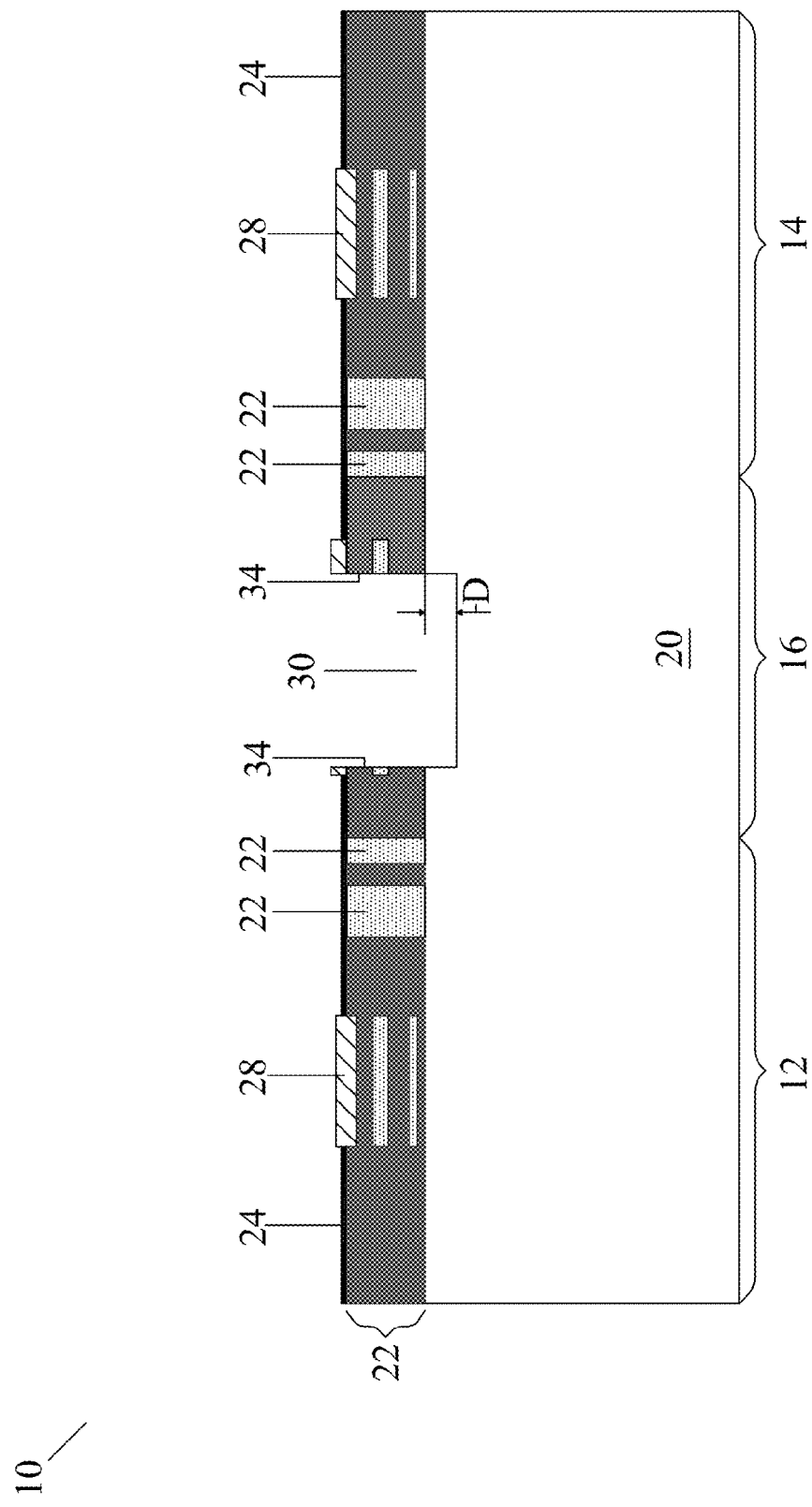

Referring to FIGS. 2 and 3A and 3B, notch 30 is formed in scribe line 16 and on the front surface of wafer 10. In a first embodiment, as is shown in FIGS. 2 and 3A, notch 30 is formed using blade 32. Blade 32 may have sloped edges. Accordingly, notch 30 also have sloped edges 34, wherein the tilt angle α may be less than about 80 degrees, depending on the shapes of blade 32. In a second embodiment, as shown in FIG. 3B, notch 30 is formed using a laser. Accordingly, the sidewalls 34 of notch 30 are substantially vertical. Notch 30 preferable extends into semiconductor substrate 20 for a depth D, for example, between about 10 μm and about 20 μm, although greater or smaller depth D may also be used. Notch 30 stops at an intermediate level between a top surface (the surface facing up in FIG. 2) and a bottom surface (the surface facing down in FIG. 2) of substrate 20. In the embodiment that a laser is used to form notch 30, the process can be controlled so that notch 30 stops at the interface between semiconductor substrate 20 and interconnect structure 22, or in other words, with depth D equal to 0 μm. It is noted that in a top view, wafer 10 has a plurality of scribe lines 16, often forming a grid with a first plurality of scribe lines (not shown) parallel to each other, and a second plurality of scribe lines (not shown) parallel to each other, and the first plurality of scribe lines is perpendicular to the second scribe lines. Notch(es) 30 are formed in each of the first and the second plurality of scribe lines, and hence also forming a grid. In other words, all scribe lines in the wafer may be notched. Particularly, in each of the first plurality of scribe lines and the second plurality of scribe lines, the notches preferably extend substantially from one end to the opposite end of the respective scribe line.

Figure 4:
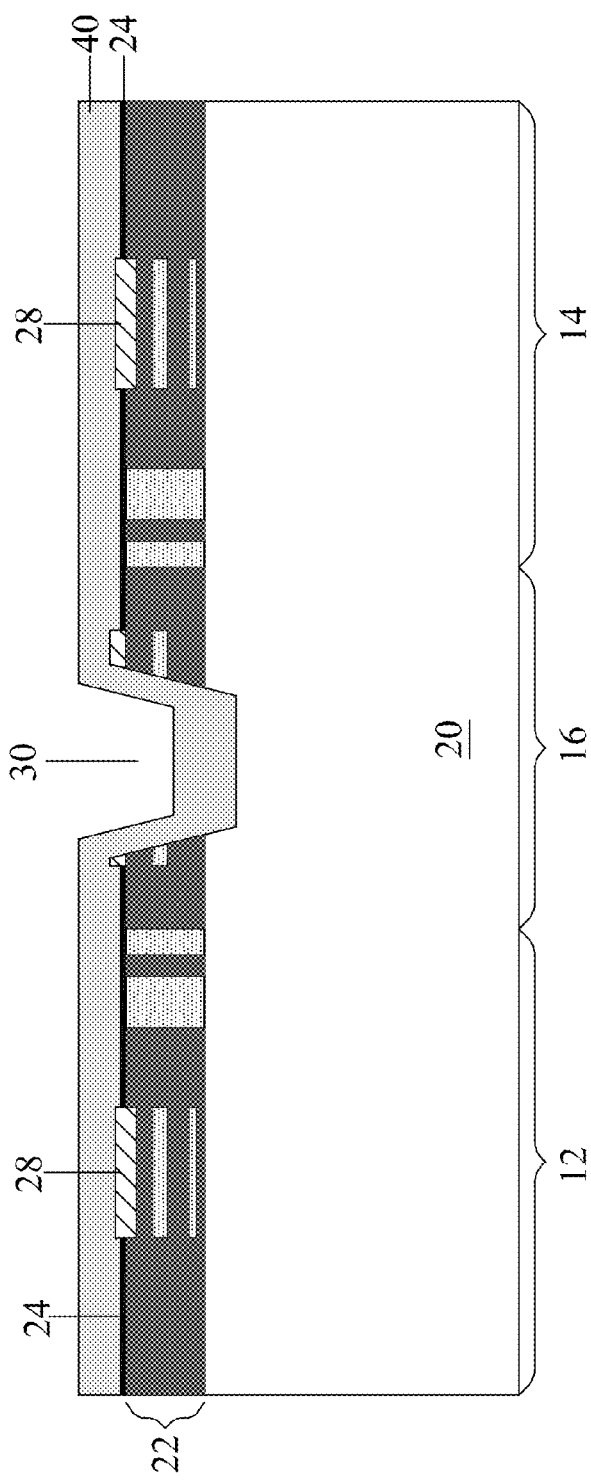
Figure 5:
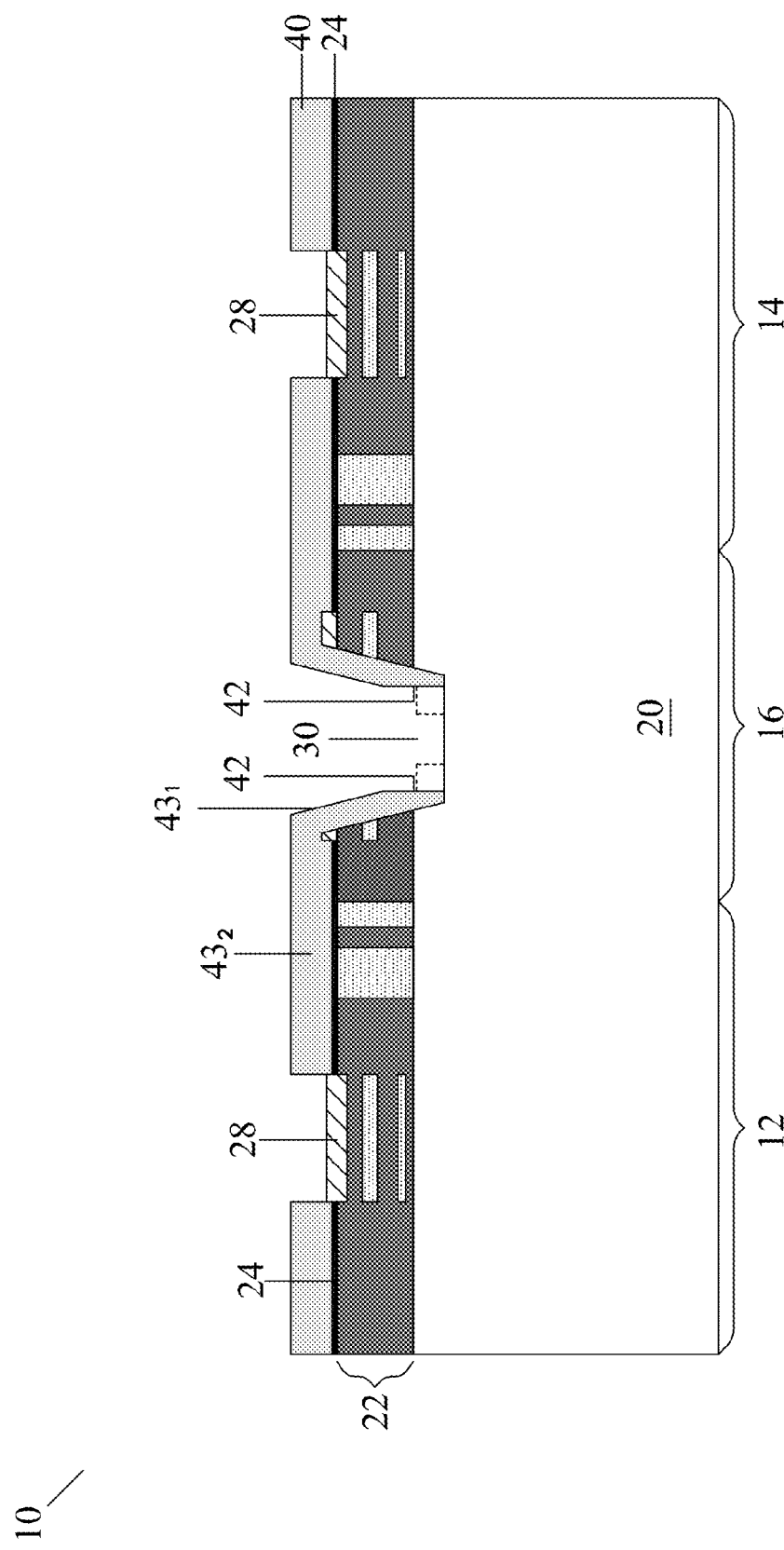

FIGS. 4 and 5 illustrate the formation, the curing, and the patterning of insulation film 40. Insulation film 40 may be formed of polybenzoxazole (PBO) resin, or other organic or non-organic materials having a good moisture resistance property and strong adhesiveness. In FIG. 4, insulation film 40 is blanket coated, and then cured, for example, using thermal curing. In FIG. 5, a patterning is performed to expose pads 28. In the preferred embodiment, a center portion of insulation film 40 in notch 30 is removed. In alternative embodiments, the portion of insulation film 40 in notch 30 is not removed. Preferably, the remaining portions of insulation film 40 cover the interface between semiconductor substrate 20 and interconnect structure 22, wherein solid lines and dotted lines show possible positions of edges 42. If viewed from the top, edges 42 will be parallel to the lengthwise direction of scribe line 16. Please note that insulation film 40 is relatively conformal, with portion $43_1$ of top surface 43 directly over (in other words, in the range of) notch 30 being lower than portions $43_2$ directly over chips 12 and 14.

Figure 6:
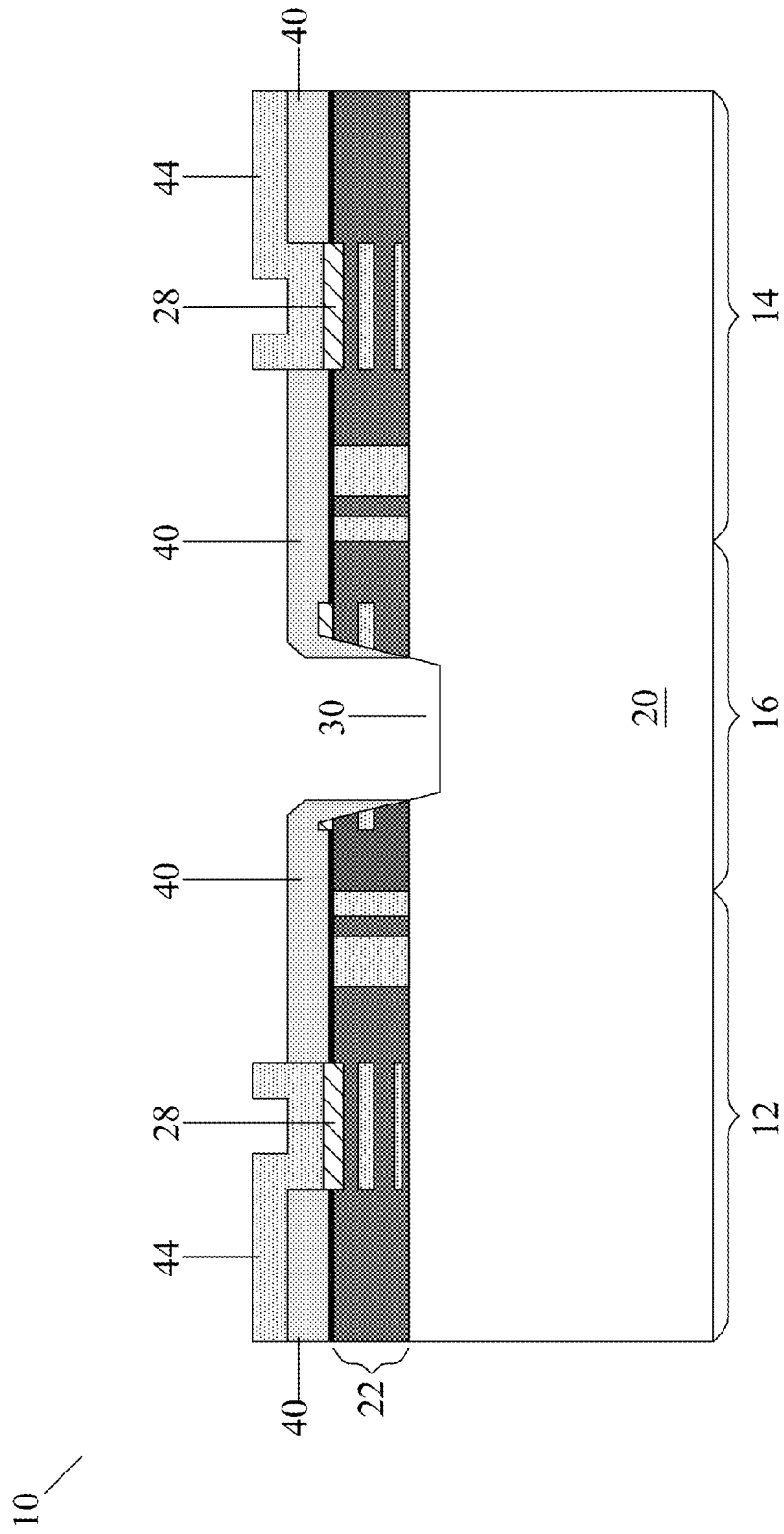

FIG. 6 illustrates the formation and patterning of redistribution lines 44, also referred to as post-passivation interconnects (PPI) 44 or runners 44. In an embodiment, the formation of redistribution lines 44 includes sputtering or plating to form a metal layer, for example, comprising aluminum or other metal alloy, and patterning the metal layer. In alternative embodiments, the redistribution lines 44 are formed by selective plating. Redistribution lines 44 are electrically connected to pads 28.

Figure 7:
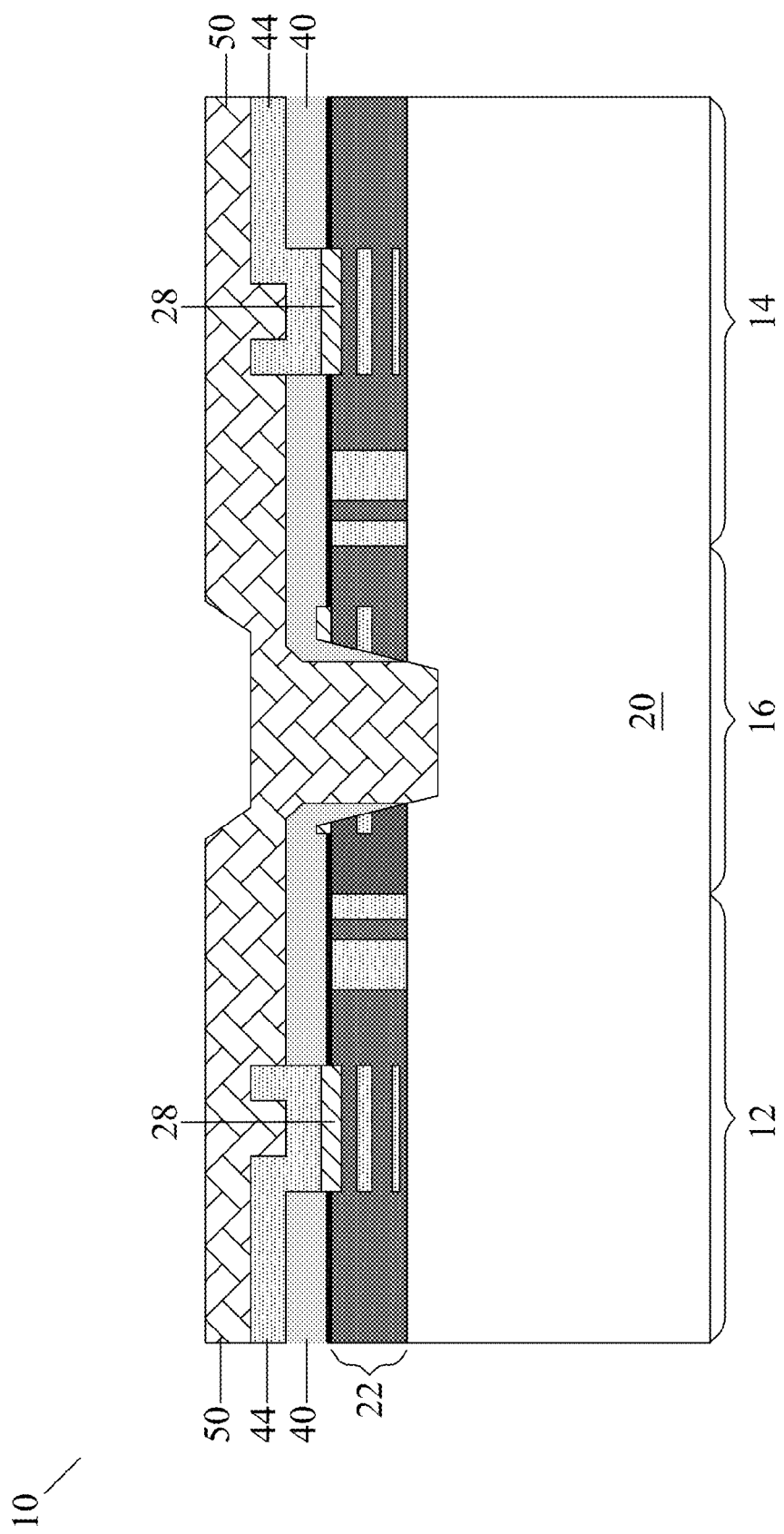
Figure 8A:
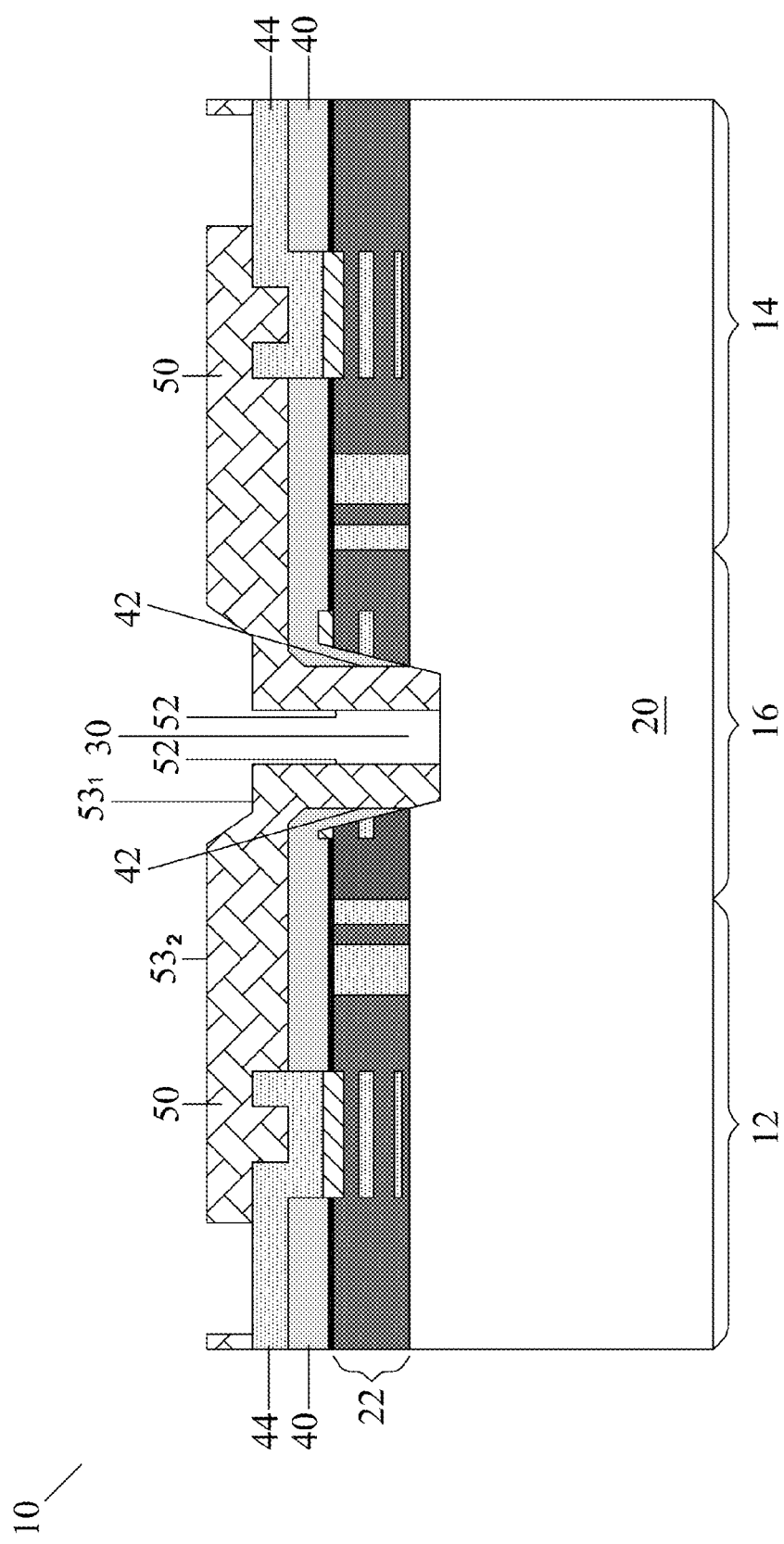
Figure 8B:
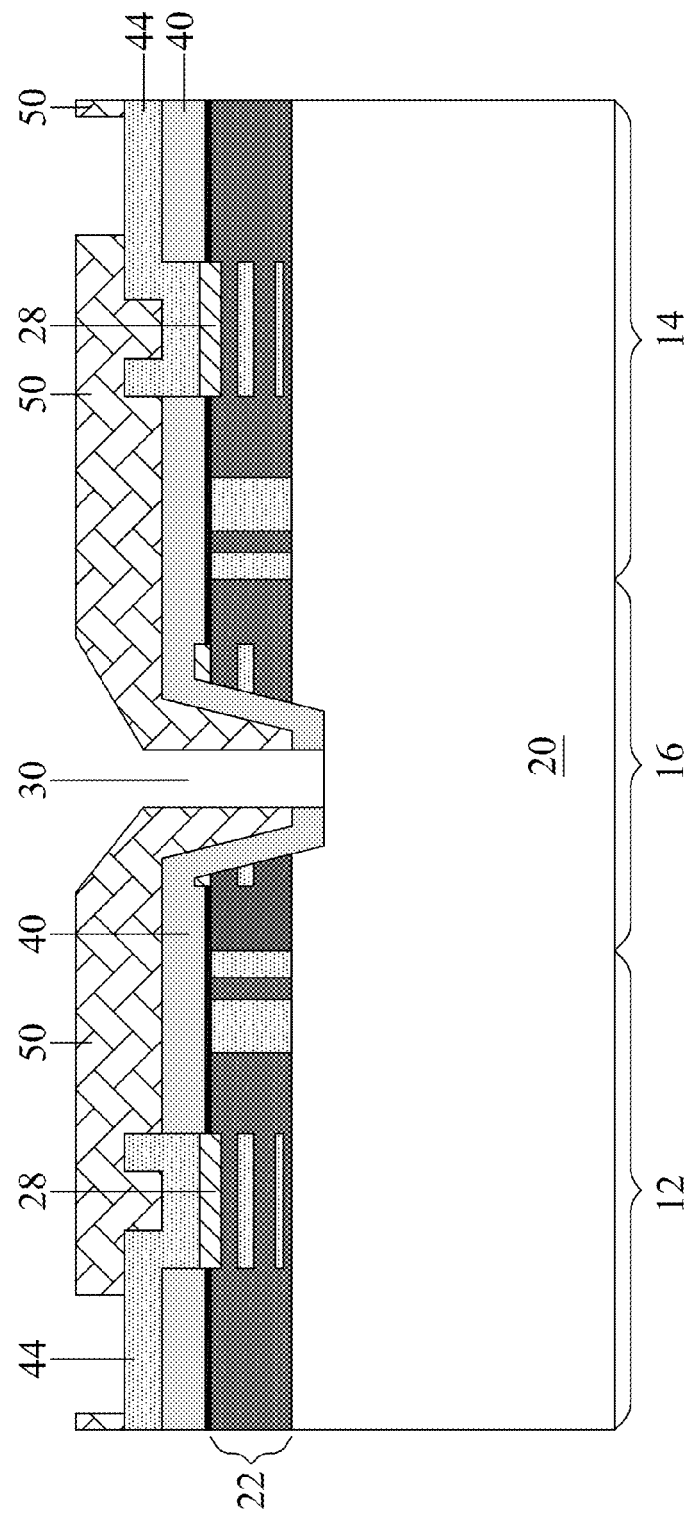

FIGS. 7, 8A and 8B illustrate the formation, the curing, and the patterning of insulation film 50, which may also be formed of polybenzoxazole (PBO) resin, or other organic or non-organic materials having a good moisture resistance property and strong adhesiveness. The materials of insulation films 40 and 50 may be the same or different. In FIG. 7, insulation film 50 is blanket coated, and then cured, for example, using thermal curing. In FIG. 8A, a patterning is performed to expose portions of redistribution lines 44. In the preferred embodiment, a center portion of insulation film 50 in notch 30 is removed. In alternative embodiments, the portion of insulation film 50 in notch 30 is not removed. Further, in the preferred embodiment, the edges 52 of the remaining portions of insulation film 50 extend beyond the respective edges 42 of insulation film 40, and hence the interfaces between insulation films 40 and 50 are hidden. Alternatively, as shown in FIG. 8B, the interfaces between insulation films 40 and 50 are exposed to notch 30. Please note that insulation film 50 has a top surface 53, and the portion $53_1$ of top surface 53 directly over notch 30 is lower than portions $53_2$ directly over chips 12 and 14.

Figure 9:
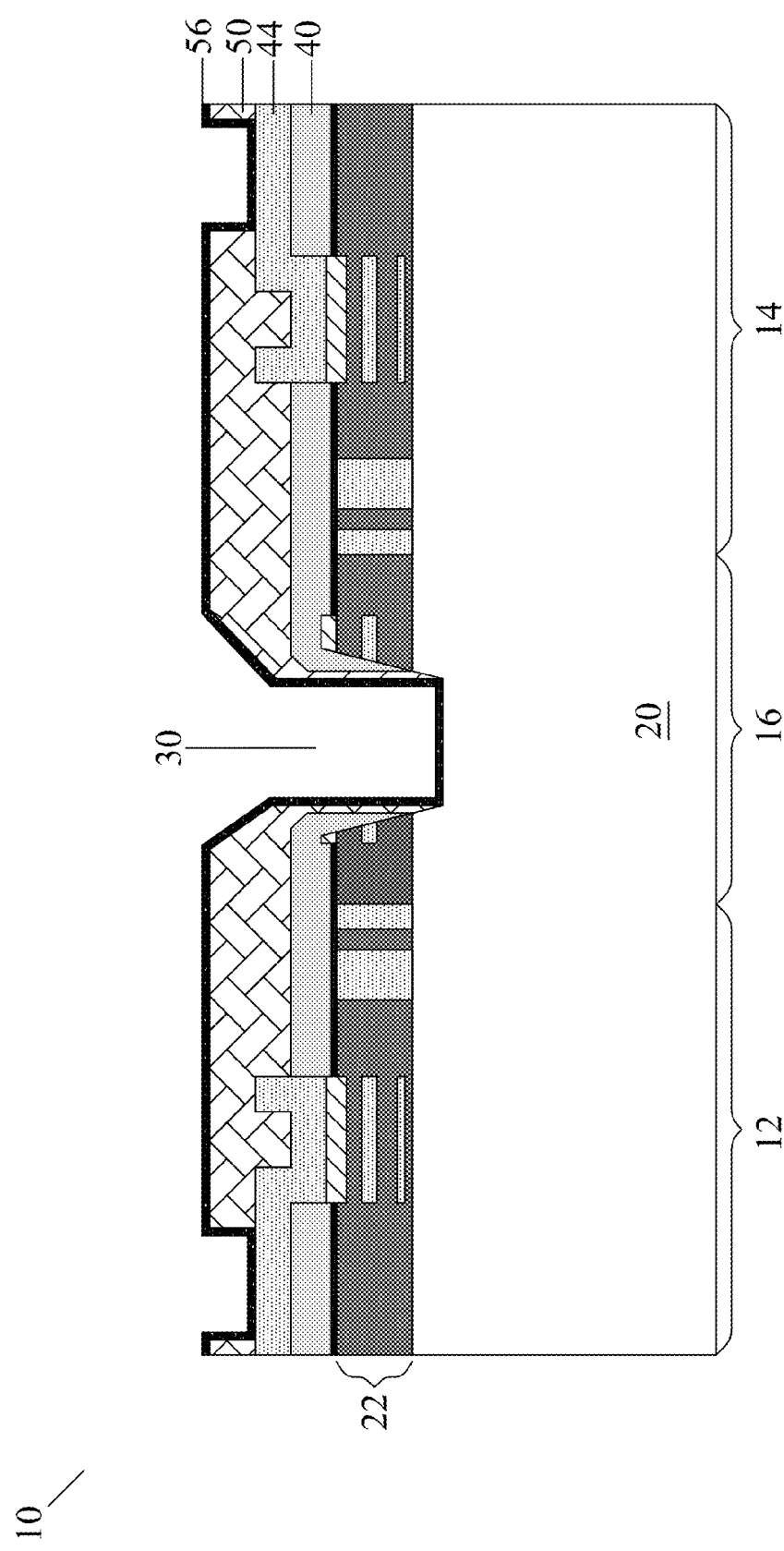

Referring to FIG. 9, a thin seed layer 56, also referred to as an under-bump metallurgy (UBM), is blanket formed. The materials of seed layer 56 include copper or copper alloys. However, other metals, such as silver, gold, aluminum, and combinations thereof, may also be included. In an embodiment, UBM 56 is formed using sputtering. In other embodiments, physical vapor deposition (PVD) or electro plating may be used. UBM 56 may have a thickness of less than about 1 μm.

Figure 10:
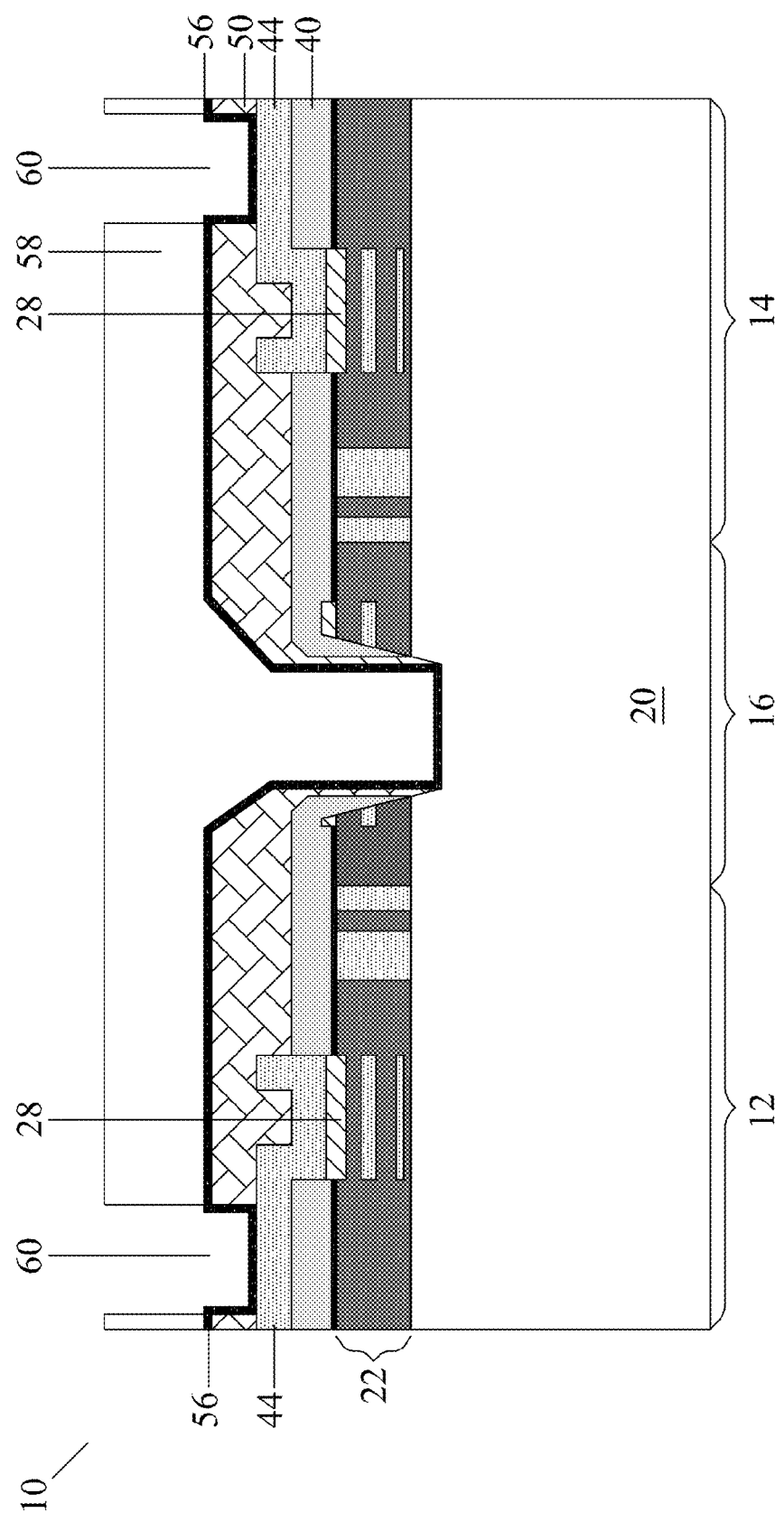

FIG. 10 illustrates the formation of mask 58. In the preferred embodiment, mask 58 is a photo resist, although it may be formed of other materials such as dry films (including Ajinimoto buildup film (ABF)). Mask 58 is then patterned, and openings 60 are formed in mask 58, exposing the portions of UBM 56 directly over portions of redistribution lines 44.

Figure 11:
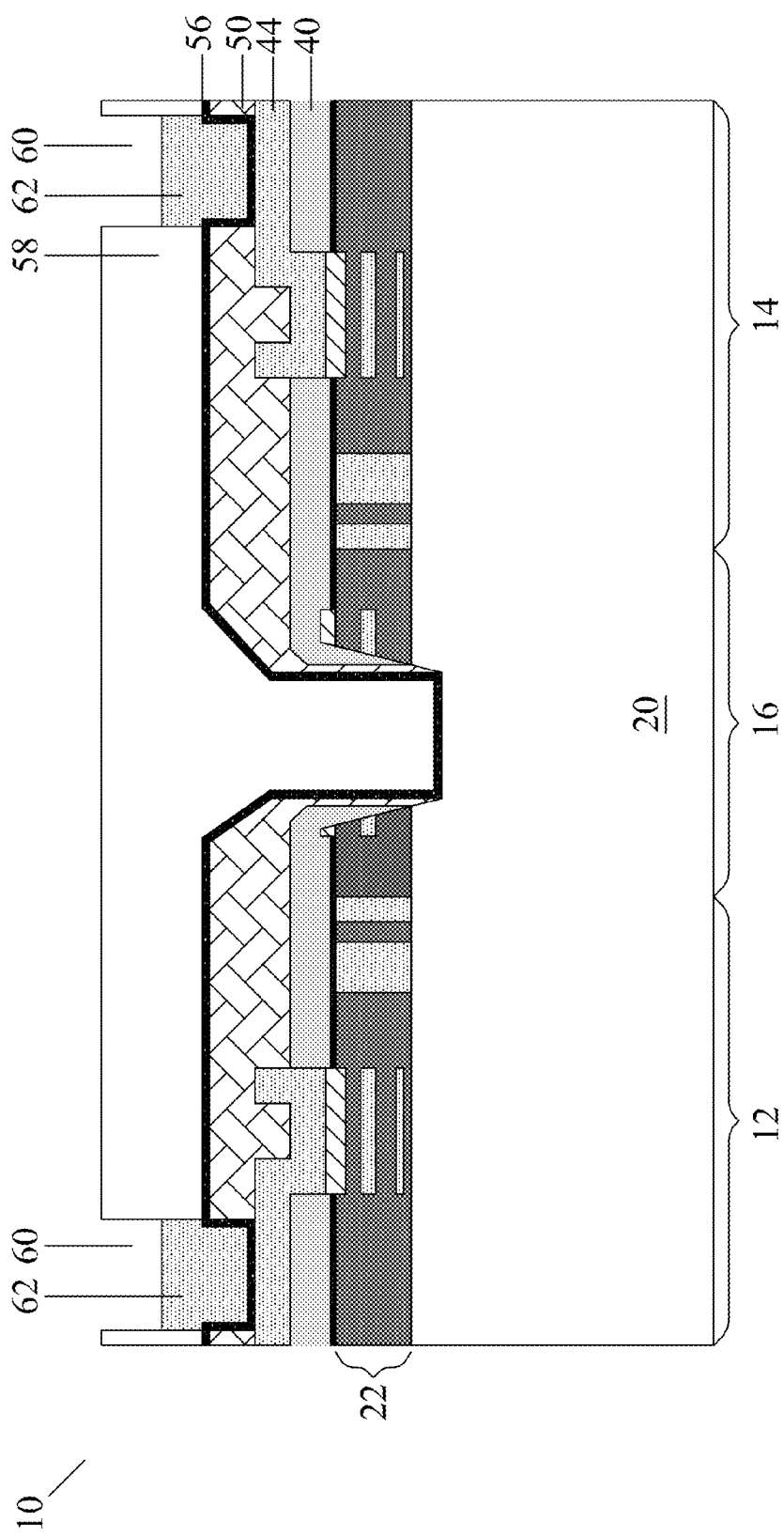

In FIG. 11, openings 60 are selectively filled with a metallic material, forming UBM pads 62 in openings 60. In the preferred embodiment, the filling material includes copper or copper alloys. However, other metals, such as aluminum, silver, gold, and combinations thereof, may also be used. The formation methods preferably include electroless plating, although other commonly used deposition methods such as sputtering, printing, electro plating, and chemical vapor deposition (CVD) methods may also be used. In alternative embodiments, instead of forming UBM pads 62, a solder material is plated in openings 60.

Figure 12:
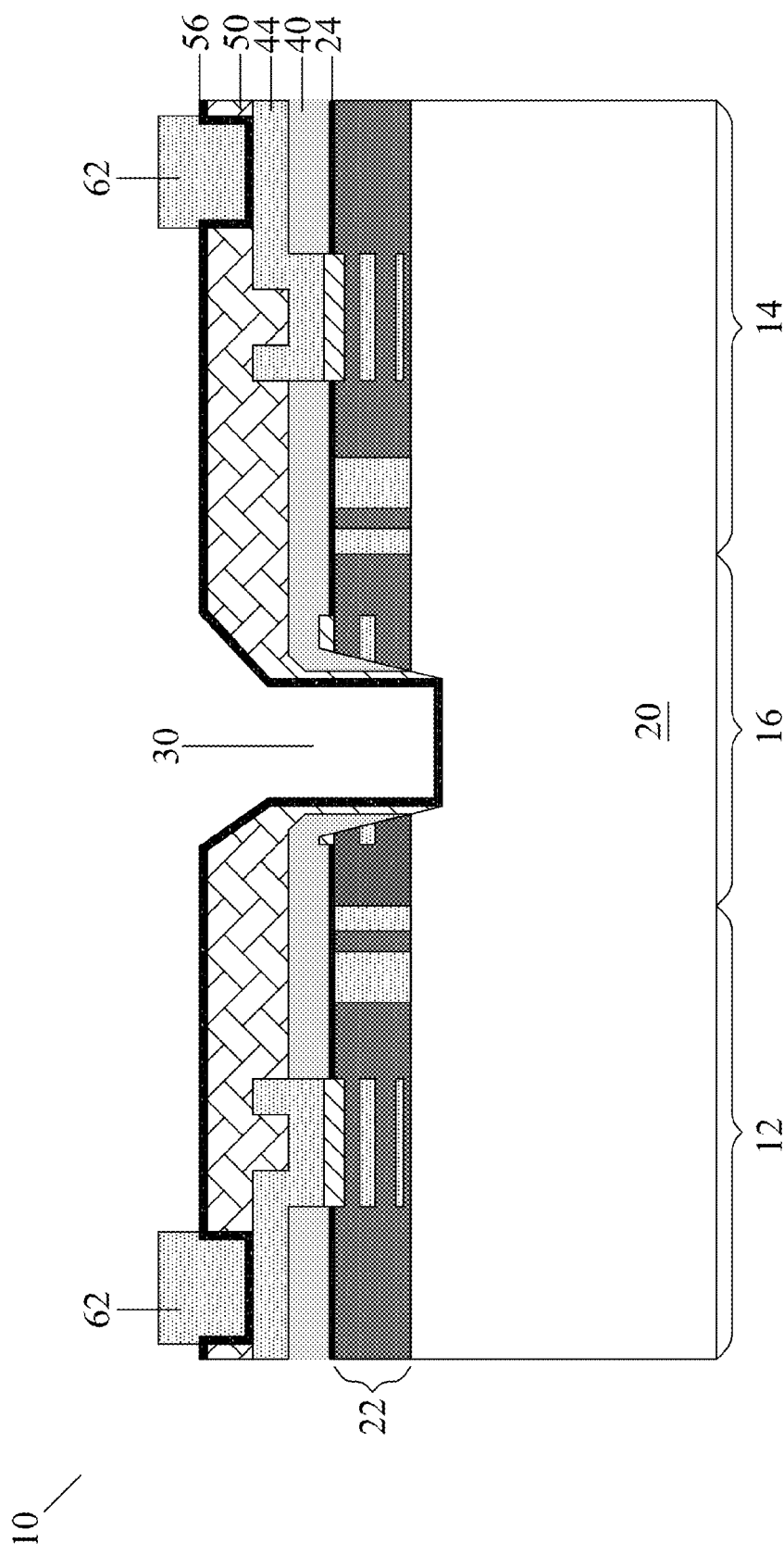
Figure 13:
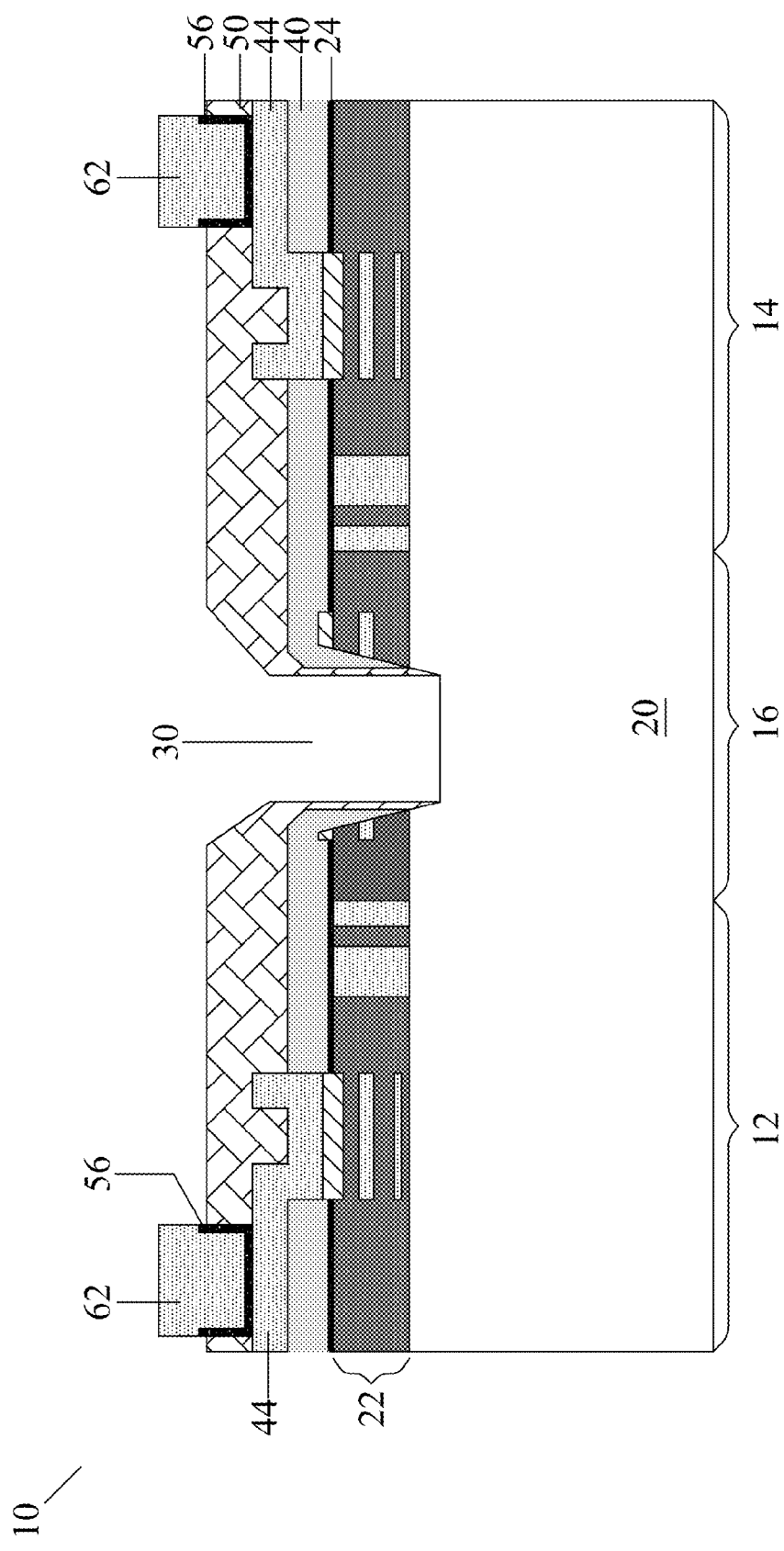

In FIG. 12, mask 58 is removed. As a result, the portions of UBM 56 underlying mask 58 are exposed. The exposed portions of UBM 56 are then removed by a flash etch. The resulting structure is shown in FIG. 13. It is noted that UBM 56 may not be distinguishable from the overlying UBM pads 62 since UBM 56 may be formed of similar materials as UBM pads 62, and thus they appear to be merged.

Figure 14:
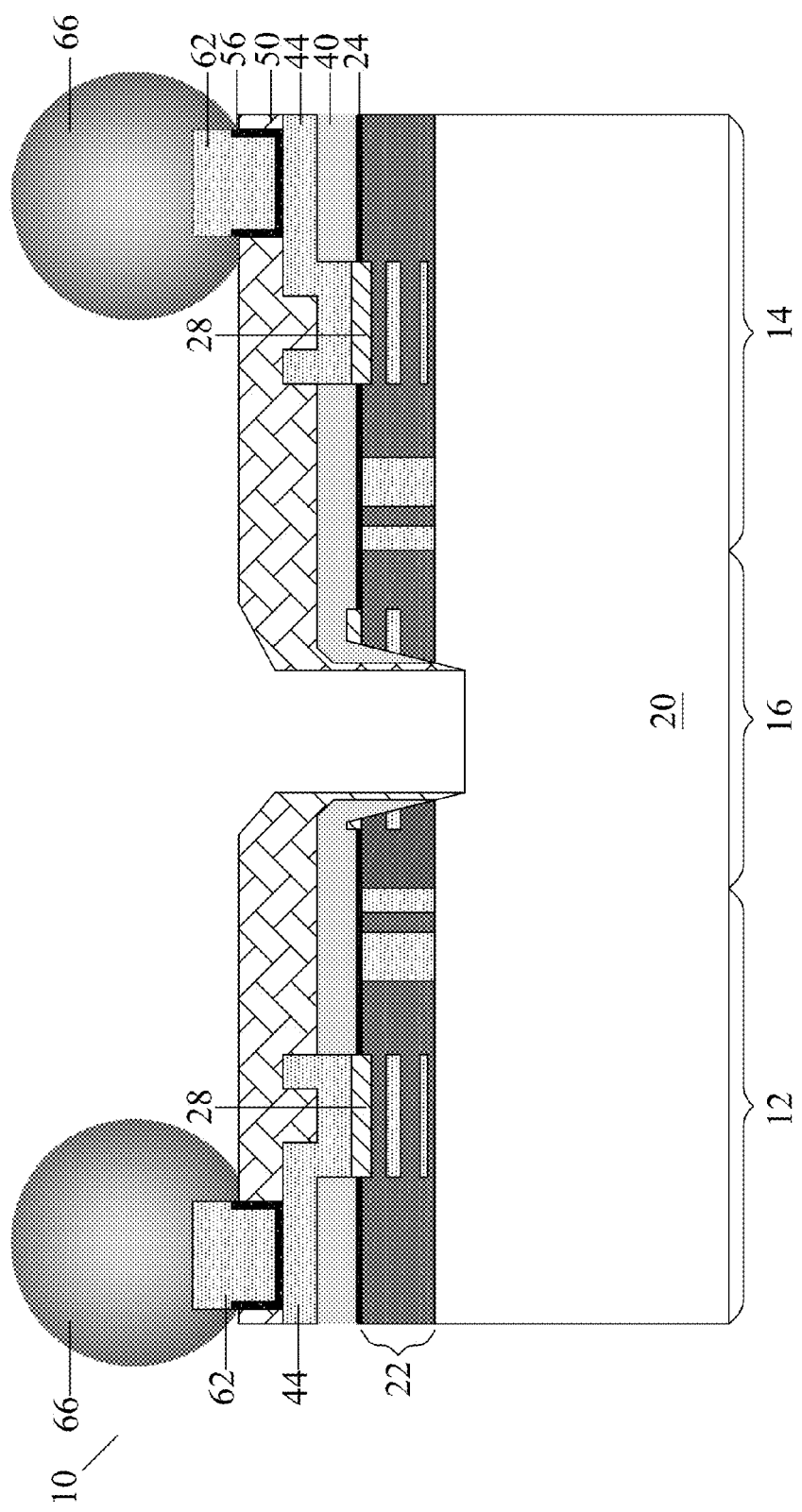

Next, as shown in FIG. 14, solder balls 66 are placed on top of UBM pads 62. In alternative embodiments in which features 62 are formed of a solder material, the solder material is re-flowed, forming solder balls 66. In which case, solder balls 66 do not have UBM pads 62 underneath.

Figure 15:
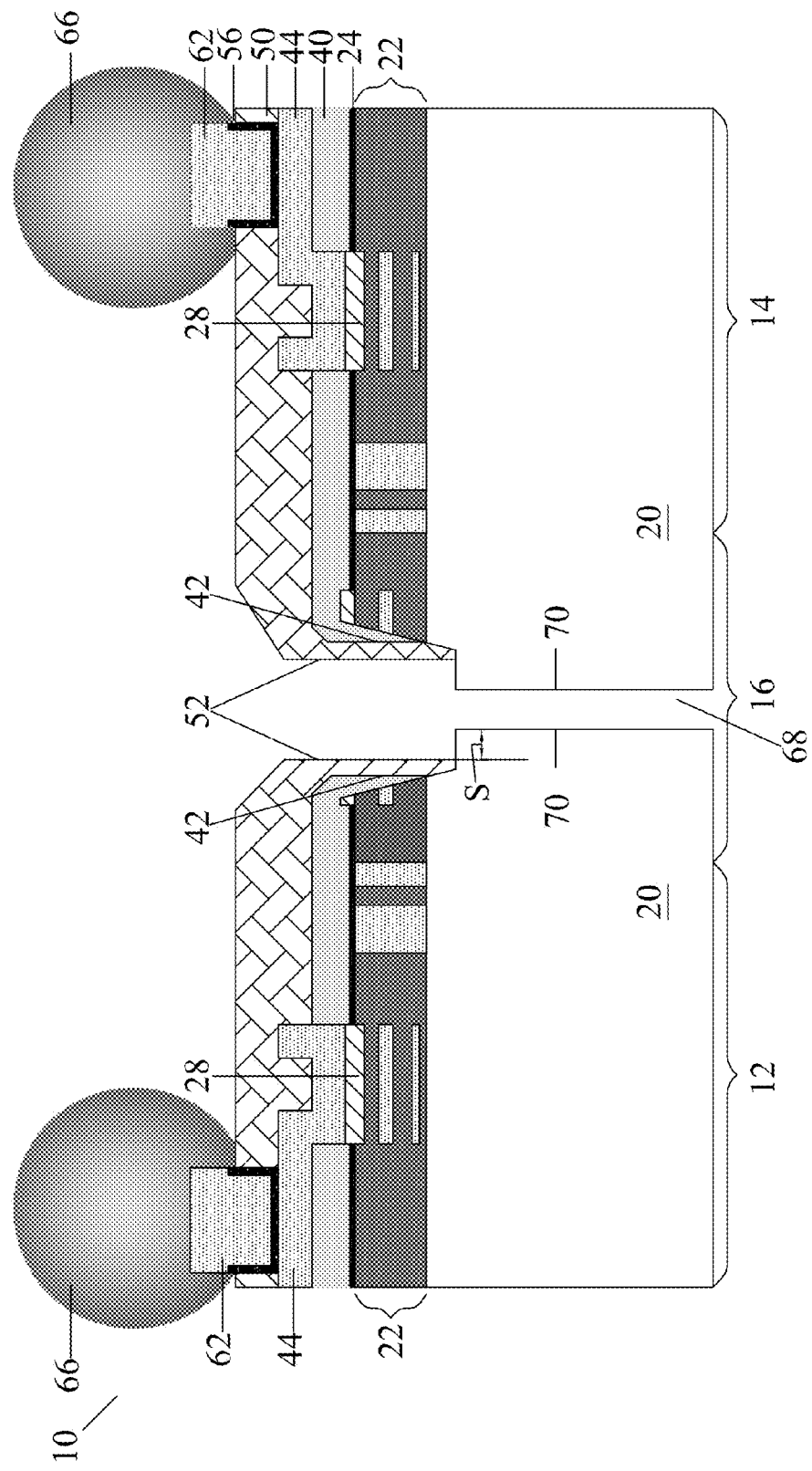

Referring to FIG. 15, wafer 10 is sawed, so that chips 12 and 14 are separated. In the preferred embodiment, kerf 68 does not contact insulation films 40 and 50. This advantageously avoids the mechanical stress applied on insulation films 40 and 50, which may adversely cause the delamination of insulation films 40 and 50. As a result, edges 70 of semiconductor substrate 20 are substantially parallel to, and vertically misaligned with, edges 42 and 52 of insulation films 40 and 50, respectively. Accordingly, edges 70 of semiconductor substrate 20 and edges 52 of insulation film 50 (or edges 42) have non-zero horizontal spacings S. Since each of chips 12 and 14 has four edges, there will be one notch at each of the four edges. Accordingly, chips 12 and/or 14 may have a notch ring with four sides. Even if one kerf 68 deviates from the desirable path and cuts through one of the insulation films 40 and 50, since a chip has four edges, most likely, at least one of the sides of a chip will have misaligned edges 70 and 42/52.

Figure 16:
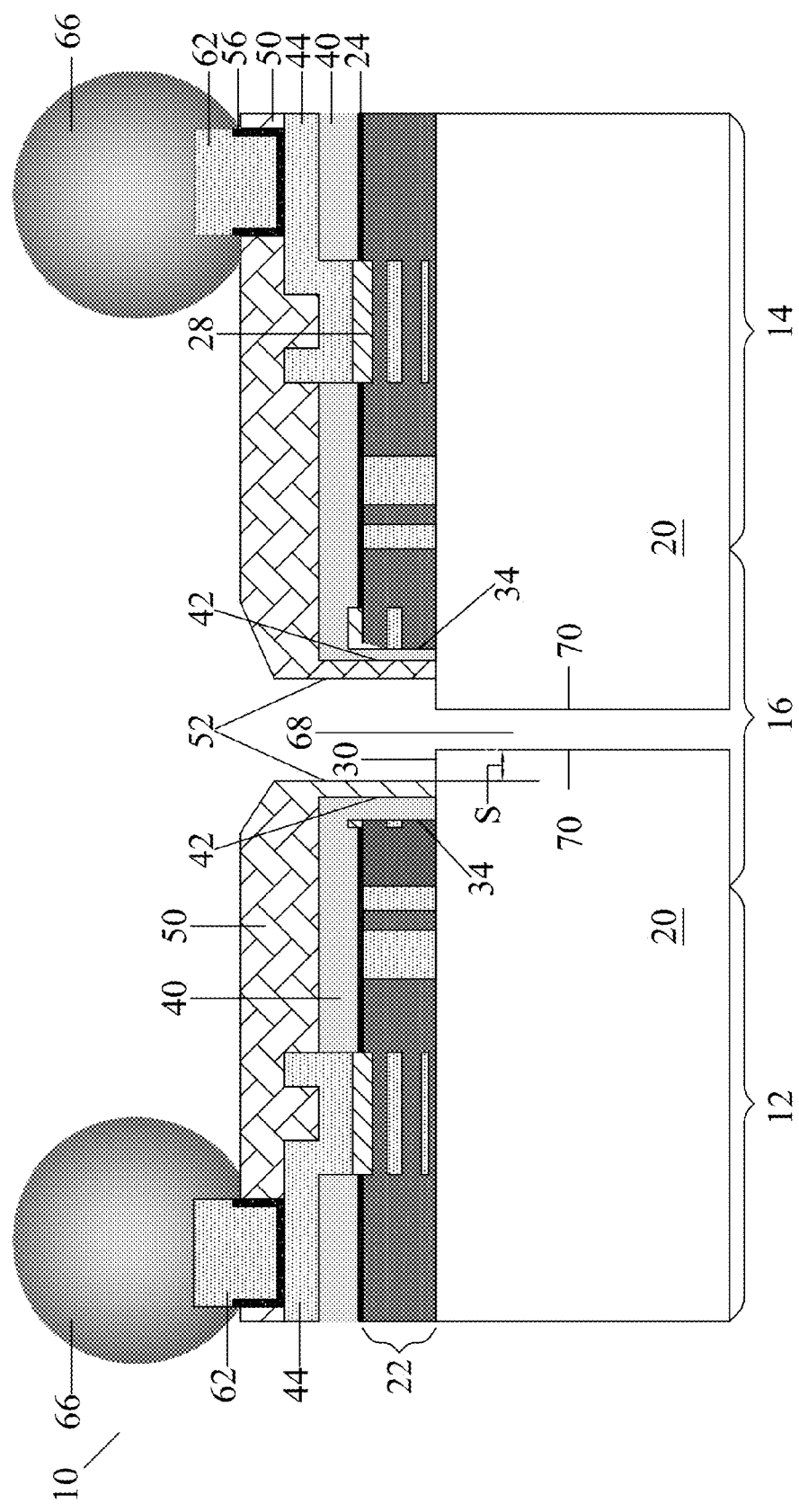

FIG. 16 illustrates an alternative embodiment, in which notch 30 is formed using a laser. Accordingly, sidewalls 34 of notch 30 are vertical. The formation processes and materials of the structure shown in FIG. 16 are essentially the same as in FIG. 15.

Although in the previously discussed embodiments, two insulation films 40 and 50 are discussed, it is possible to form only one insulation film similar to insulation film 50. In this case, redistribution lines 44, instead of being formed on insulation film 40, may be formed directly on passivation layer 24, and the formation of insulation film 40 is skipped. Again, insulation film 50 will extend into notch 30 to cover the interface between semiconductor substrate 20 and the overlying interconnect structure 22.

The structures shown in FIGS. 15 and 16 advantageously result in the bottoms of insulation films 40 and 50 to extend down into semiconductor substrate 20. Accordingly, the conventional weak interfaces between insulation film 50 and passivation layer 24, which are prone to delamination, and through which moisture may penetrate into chips 12 and 14, are protected. Experimental results have shown that the circuit degradation and failure caused by the above-discussed delamination are substantially eliminated. Advantageously, the embodiments of the present invention only require an additional notch formation process, and no additional lithograph steps and mask are required.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing a wafer comprising:
   a semiconductor substrate;
   an interconnect structure over the semiconductor substrate;
   a first semiconductor chip comprising a first portion of the semiconductor substrate and a first portion of the interconnect structure;
   a second semiconductor chip comprising a second portion of the semiconductor substrate and a second portion of the interconnect structure; and a scribe line between and adjoining the first semiconductor chip and the second semiconductor chip;

forming a notch in the scribe line, wherein the notch extends from a top surface of the wafer to stop at an intermediate level between a top surface and a bottom surface of the semiconductor substrate, and extends substantially from one end to an opposite end of the scribe line, wherein the notch comprises a bottom surface, with the bottom surface being a surface of a semiconductor material of the semiconductor substrate;

forming a first insulation film over the wafer, wherein the first insulation film extends into the notch and contacts the bottom surface of the notch;

patterning the first insulation film to remove a portion of the first insulation film from a center of the notch, wherein a remaining portion of the first insulation film comprises a first edge in the notch;

forming a second insulation film over the first insulation film, wherein the second insulation film extends into the notch and contacts the bottom surface of the notch;

patterning the second insulation film to remove a portion of the second insulation film from the center of the notch, wherein a remaining portion of the second insulation film comprises a second edge in the notch, and wherein a bottom surface of the first insulation film in the notch and a bottom surface of the second insulation film in the notch are level with each other; and sawing the wafer to separate the first semiconductor chip and the second semiconductor chip.

2. The method of claim 1, wherein the notch comprises slanted sidewalls.

3. The method of claim 1 further comprising:
forming a redistribution line between the first insulation and the second insulation film; and
forming a solder ball on a top surface of the wafer, wherein the solder ball is electrically connected to the redistribution line through an opening in the second insulation film.

4. The method of claim 1, wherein during the step of sawing, a kerf for the sawing is horizontally between, and spaced apart from, the first edge and the second edge, and wherein the first edge and the second edge are both located in the first semiconductor chip after the step of sawing.

5. The method of claim 1, wherein after the step of patterning the second insulation film, a remaining portion of the second insulation film covers the first edge of the first insulation film.

6. The method of claim 1, wherein the step of forming the notch is performed by a laser, and wherein the notch has substantially vertical sidewalls.

7. The method of claim 1, wherein the interconnect structure comprises:
dielectric layers; and
metal lines and vias in the dielectric layers.

8. A method of forming an integrated circuit structure, the method comprising:
providing a wafer comprising:
a semiconductor substrate;
an interconnect structure over the semiconductor substrate;
a first semiconductor chip comprising a first portion of the semiconductor substrate and a first portion of the interconnect structure;
a second semiconductor chip comprising a second portion of the semiconductor substrate and a second portion of the interconnect structure; and
a scribe line between and adjoining the first semiconductor chip and the second semiconductor chip;

forming a notch in the scribe line, wherein the notch extends from a top surface of the wafer to stop at an intermediate level between a top surface and a bottom surface of the semiconductor substrate, and extends substantially from one end to an opposite end of the scribe line, wherein the notch comprises a bottom surface, with the bottom surface being a surface of a semiconductor material of the semiconductor substrate;

forming a first insulation film over the wafer, wherein the first insulation film extends into the notch and contacts the bottom surface of the notch;

patterning the first insulation film to remove a portion of the first insulation film from a center of the notch, wherein a remaining portion of the first insulation film comprises a first edge in the notch;

forming a second insulation film over the first insulation film, wherein the second insulation film extends into the notch and contacts the bottom surface of the notch;

patterning the second insulation film to remove a portion of the second insulation film from the center of the notch, wherein a remaining portion of the second insulation film comprises a second edge in the notch, and wherein the bottom surface of the first insulation film in the notch and the bottom surface of the second insulation film in the notch are coplanar; and sawing the wafer to separate the first semiconductor chip and the second semiconductor chip.

9. The method of claim 8, wherein the notch comprises slanted sidewalls.

10. The method of claim 8 further comprising:
forming a redistribution line between the first insulation and the second insulation film; and
forming a solder ball on a top surface of the wafer, wherein the solder ball is electrically connected to the redistribution line through an opening in the second insulation film.

11. The method of claim 8, wherein during the step of sawing, a kerf for the sawing is horizontally between, and spaced apart from, the first edge and the second edge, and wherein the first edge and the second edge are both located in the first semiconductor chip after the step of sawing.

12. The method of claim 8, wherein after the step of patterning the second insulation film, a remaining portion of the second insulation film covers the first edge of the first insulation film.

13. The method of claim 8, wherein the step of forming the notch is performed by a laser, and wherein the notch has substantially vertical sidewalls.

14. The method of claim 8, wherein the interconnect structure comprises:
dielectric layers; and
metal lines and vias in the dielectric layers.

* * * * *